United States Patent
Mehrotra et al.

(10) Patent No.: US 9,263,147 B2
(45) Date of Patent: Feb. 16, 2016

(54) METHOD AND APPARATUS FOR CONCURRENT TEST OF FLASH MEMORY CORES

(71) Applicant: Texas Instruments Incorporated, Dallas, TX (US)

(72) Inventors: Rajat Mehrotra, New Delhi (IN); Rubin Ajit Parekhji, Bangalore (IN); Maheedhar Jalasutram, Bangalore (IN); Charu Shrimali, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/490,170

(22) Filed: Sep. 18, 2014

(65) Prior Publication Data

US 2015/0325308 A1 Nov. 12, 2015

Related U.S. Application Data

(60) Provisional application No. 61/990,320, filed on May 8, 2014.

(51) Int. Cl.
| | |
|---|---|
| *G11C 16/04* | (2006.01) |
| *G11C 16/34* | (2006.01) |
| *G11C 16/14* | (2006.01) |
| *G11C 29/12* | (2006.01) |
| *G11C 16/16* | (2006.01) |
| *G11C 16/10* | (2006.01) |
| *G11C 16/26* | (2006.01) |
| *G11C 16/08* | (2006.01) |

(52) U.S. Cl.
CPC ............ *G11C 16/3422* (2013.01); *G11C 16/08* (2013.01); *G11C 16/10* (2013.01); *G11C 16/14* (2013.01); *G11C 16/16* (2013.01); *G11C 16/26* (2013.01); *G11C 29/12* (2013.01); *G11C 16/0483* (2013.01)

(58) Field of Classification Search
CPC .... G11C 16/14; G11C 16/3422; G11C 29/12; G11C 16/08; G11C 16/10; G11C 16/16; G11C 16/0483; G11C 16/26
USPC ............ 365/185.11, 189.07, 233.1, 189.011, 365/201
See application file for complete search history.

(56) References Cited

U.S. PATENT DOCUMENTS

| | | | | |
|---|---|---|---|---|
| 5,675,545 | A * | 10/1997 | Madhavan | ............. G11C 29/54 365/201 |
| 7,130,230 | B2 * | 10/2006 | Jain | ........................ G11C 29/38 365/201 |

(Continued)

*Primary Examiner* — Pho M Luu
(74) *Attorney, Agent, or Firm* — John Pessetto; Frank D. Cimino

(57) ABSTRACT

An apparatus for concurrent test of a set of flash memory banks apparatus includes a memory data path (MDP) module coupled to a test controller. The MDP module includes a test control module configured to generate a concurrent control signal that configures the set of flash memory banks to be tested simultaneously; and a set of comparators, that generates a first comparator output in response to the concurrent control signal and an input from the set of flash memory banks. A reduction logic is configured to generate a reduction logic output that combines a status of the comparator outputs to be compressed. A control logic is configured for selective programming across different flash bits of the set of flash memory banks. A fail flag is configured to generate one of an output value '0' if there is a mismatch in data read from the set of flash memory banks in any access, and an output value 1 if there is no mismatch in data read in any access.

16 Claims, 4 Drawing Sheets

(56) References Cited

U.S. PATENT DOCUMENTS 7,197,678 B2 * 3/2007 Ohlhoff ................ G11C 29/40
365/201

7,260,759 B1 * 8/2007 Zarrineh ............ G01R 31/3187
365/201

8,122,304 B2 * 2/2012 Fujiwara ................ G11C 29/44
365/201

* cited by examiner

METHOD AND APPARATUS FOR CONCURRENT TEST OF FLASH MEMORY CORES

CROSS REFERENCES TO RELATED APPLICATIONS

This application claims priority from U.S. provisional patent application No. 61/990,320 filed on May 8, 2014, which is hereby incorporated by reference in its entirety.

TECHNICAL FIELD

Embodiments of the disclosure relate to concurrent test of flash memory cores in an integrated circuit.

BACKGROUND

Flash memory is a non-volatile memory, i.e. flash memory can retain a state even without power supply. Flash memory stores a state based on the changes in the threshold voltage ($V_T$) of a floating gate metal oxide semiconductor (MOS) transistor. Flash test (testing of flash memory) therefore needs to characterize the threshold voltage and associated bit cell current (BCC) of each flash bit in the design. Characterization involves measuring variations or shifts in the threshold voltage ($V_T$) and bit cell current (BCC) due to each of current (I), voltage (V) and temperature (T) stress application. The number of I, V and T stress conditions for the flash bit are many and are required to screen reliability of a floating gate flash bit. Due to this requirement, a large number of read operations need to be performed per search cycle for each stress condition.

Flash access time is much slower compared to an equivalent static random access memory (SRAM) access time requiring higher test time per read iteration. Flash core architecture is different from the SRAM because the operations such as program or erase can require multiple attempts for the bit cell to store data robustly. With development in technology, on chip flash has increased over 4 times in 65 nm CMOS manufacturing process compared to prior technologies causing flash test time to become 80% of device test time. As such, there is a need for a solution that restricts the linear increase in test time with increasing flash size.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an apparatus for concurrent test of a set of flash memory banks. The apparatus includes a memory data path (MDP) module coupled to a test controller. The test controller is configured to generate a test stimulus and to check a response from the set of flash memory banks. The MDP module includes a test control module configured to generate a concurrent control signal that configures the set of flash memory banks to be tested simultaneously. The MDP module also includes a set of comparators, corresponding to each of the set of flash memory banks, each comparator configured to generate a first comparator output in response to the concurrent control signal and an input from the set of flash memory banks that indicates a state of the set of flash memory banks. The MDP module further includes a reduction logic configured to generate a reduction logic output that combines a status of the comparator outputs to be compressed to match the width of a data bus of the test controller; a control logic configured to generate a control output in response to the test stimulus and the comparator output for selective programming across different flash bits of the set of flash memory banks; and a fail flag configured to generate one of an output value '0' if there is a mismatch in data read from the set of flash memory banks in any access, and an output value 1 if there is no mismatch in data read from the set of flash memory banks in any access. The first comparator output corresponds to match or mismatch between the accessed data and the expected data.

An embodiment provides an apparatus for concurrent test of a set of flash memory banks. The apparatus includes a test controller configured to generate a test stimulus and to check a response from the set of flash memory banks; an on chip memory configured to store test operation sequences being executed through the test controller; a test interface that is configured to program the test controller; and an MDP module coupled to the test controller. The MDP module includes a test control module configured to generate a concurrent control signal that configures the set of flash memory banks to be tested simultaneously; a set of comparators, corresponding to each of the set of flash memory banks, each comparator configured to generate a first comparator output in response to the concurrent control signal and an input from the set of flash memory banks that indicates a state of the set of flash memory banks; a reduction logic configured to generate a reduction logic output that combines a status of the comparator outputs; a control logic configured to generate a control output in response to the test stimulus and the first comparator output that disables an intended operation for bits having a same state as an intended data, based on the test stimulus, in the set of flash memory banks; and a fail flag configured to generate one of an output value '0' if there is a mismatch in data read from the set of flash memory banks in any access, and an output value 1 if there is no mismatch in data read from the set of flash memory banks in any access.

Another embodiment provides a method for concurrent test of a set of flash memory banks. A concurrent control signal is generated that configures the set of flash memory banks to be tested simultaneously. A test stimulus is generated and a response from the set of flash memory banks is then checked. A first comparator output is also generated in response to the concurrent control signal and an input from the set of flash memory banks that indicates a state of the set of flash memory banks, i.e. whether the state is the expected one (comparator output indicates a "pass") or an erroneous one (comparator output indicates a "fail"). Further, a reduction logic output is generated that combines a status of the comparator outputs. A control output is also generated in response to the test stimulus and the first comparator output that disables an intended operation for bits having a same state as an intended data, based on the test stimulus, in the set of flash memory banks. Finally, one of an output value '0' is generated if there is a mismatch in data read from the set of flash memory banks in any access, and an output value 1 is generated if there is no mismatch in data read from the set of flash memory banks in any access is generated.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
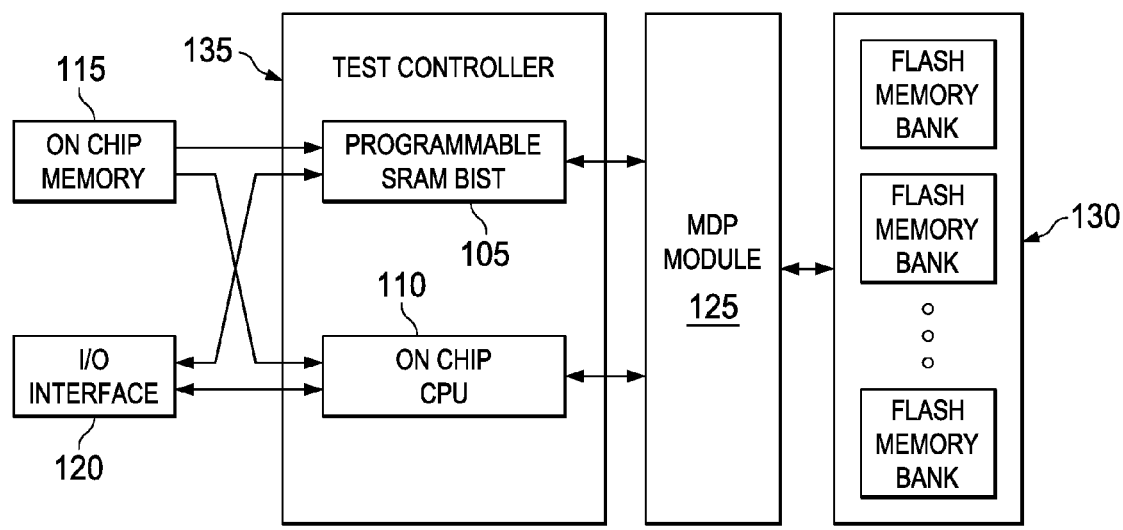
FIG. 1 is a block diagram of an apparatus for concurrent test of flash memory cores according to an embodiment.

FIG. 1 is a block diagram of an apparatus for concurrent test of flash memory cores. The apparatus includes a test controller 135 (that is programmable) coupled to a memory data path (MDP) module 125. The test controller 135 is one of a programmable built in self test (BIST) controller 105 or an on-chip processor 110. In one embodiment, the programmable BIST controller is a programmable static random access memory (SRAM) BIST controller 105. An on-chip memory 115 is also coupled to the test controller 135. The MDP module 125 is coupled to a set of flash memory banks 130. The test controller 135 generates test stimulus based on test algorithm such as sequence of address, write-data, control signals and generates the expected response to check the read data to validate the correct operation of flash memory banks 130.

Flash memory banks 130 are memories that can retain data after power down. A flash memory bank 130 can support three access mechanisms namely program or operation to write-0, erase or operation to write-1 and read or operation to retrieve the contents of flash memory bank 130. The flash program is a high voltage operation and can write to any addressed word of flash memory bank 130. Each program operation requires multiple clock cycles and may need to be repeated for weak bits in flash memory bank 130. Each program operation is preceded by a read operation to check that a programmed bit is not re-programmed. This is to ensure correct flash bit-cell operation through the life of system on chip (SOC).

Flash erase is another high voltage operation which can write to a group of flash memory bank words called as a sector. Each sector erase requires multiple clock cycles and may need to be repeated for weak bits in the sector. Each erase is therefore preceded by a read of all words in the sector and erase cycle is initiated if any of bits are in programmed state. Flash read is a single cycle operation and returns the content of addressed word.

Test algorithm can either be stored in the on-chip memory 115 or can be programmed through SoC's input/output (IO) interface 120. Storage of test algorithm allows faster test application and enables higher efficiency for multi-site application, i.e. simultaneous test application on multiple devices. MDP module 125 is the interface logic between the test controller 135, On chip CPU 110 and flash memory banks 130 to enable concurrent testing of flash memory banks 130.

The test controller 135 is configured to apply a user defined test algorithm that involves a series of flash memory bank operations and associated response validation. The test controller is configured to read the algorithm from the on-chip memory 115. Alternatively, the test controller 135 can also be programmed from the SOC's JO interface 120. The test controller 135 enables each flash memory bank operation by generating correct state of control signals and in the exact order required for correct flash memory bank access. For each flash memory bank, access response validation involves comparing the flash memory bank output to a good circuit response (expected circuit response in functional conditions).

The test controller 135 is configured to report a test-fail for a mismatch in actual flash memory bank response and a good circuit response.

The MDP 125 module contains the selection logic for the test controller to access any of the set of flash memory banks 130. The MDP 125 module and its functions are explained in detail now.

Figure 2:
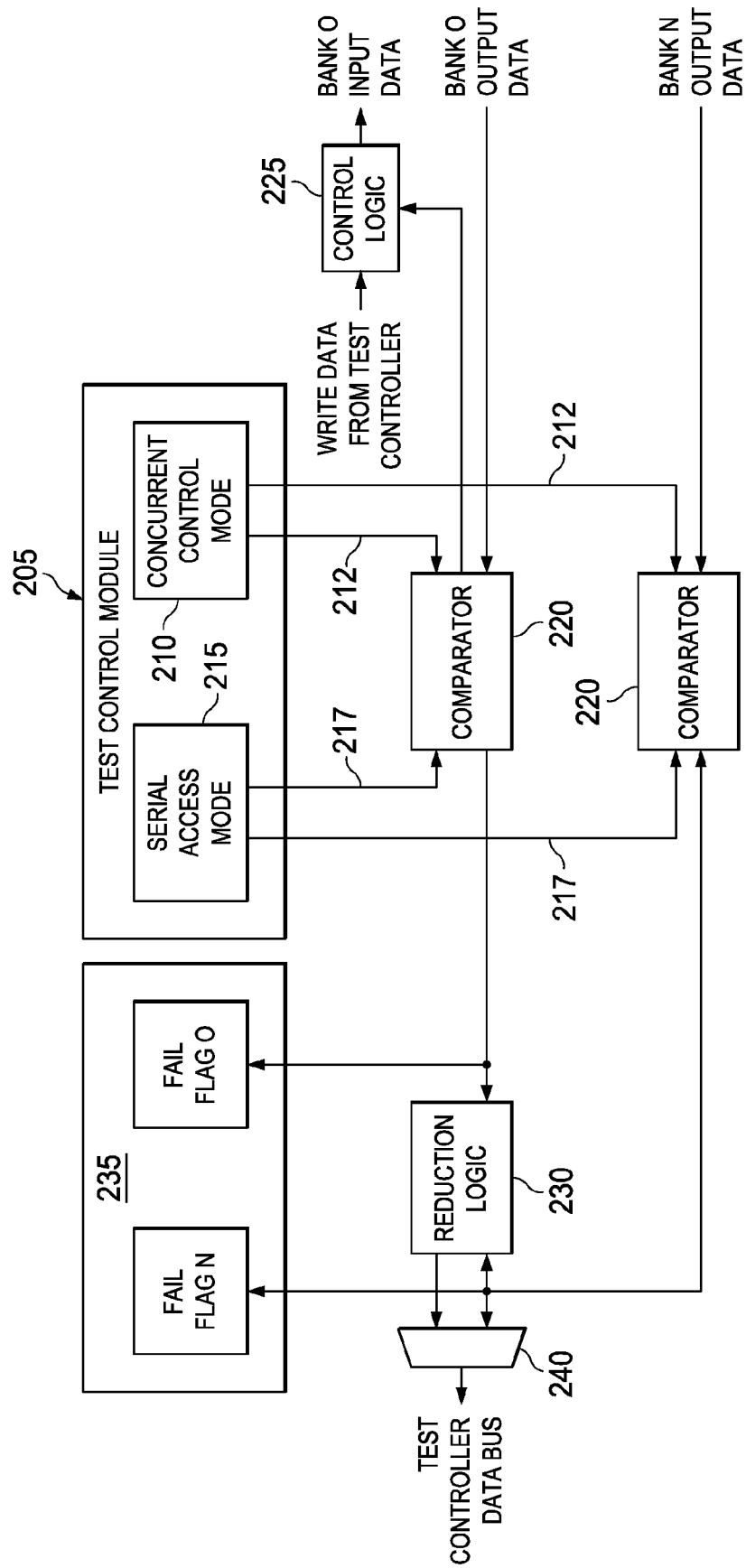
FIG. 2 is a block diagram of the memory data path module of FIG. 1.

FIG. 2 is a block diagram of the memory data path (MDP) module of FIG. 1. Memory data path module includes a test control module 205 having a concurrent control mode 210 and a serial access mode 215. The test control module 205 generates one concurrent control signal, on line 212, per flash memory bank that configures the set of flash memory banks to be tested simultaneously. The concurrent control signal 212 is coupled to a set of comparators 220, corresponding to each of the set of flash memory banks 130. Each comparator 220 is configured to generate a first comparator output in response to the concurrent control signal 212 and an input from the set of flash memory banks 130 that indicates the state of the set of flash memory banks 130. The first comparator output is coupled to a reduction logic 230 configured to generate a reduction logic output that combines the status of comparators 220 to be compressed in the test controller data bus. The first comparator output is additionally coupled to a control logic 225 that is configured to generate a control output, in response to the test stimulus and the first comparator output. This disables an intended operation for bits having a same state as an intended data, based on the test stimulus, in the set of flash memory banks 130. The first comparator output is also coupled to a fail flag 235 configured to generate one of an output value '0' if there is a mismatch from expected response in any access to the set of flash memory banks and an output value 1 if there is no mismatch in all accesses.

The serial access control signal 217 is coupled to the set of comparators 220. Each comparator 220 is configured to generate a second comparator output, in response to the serial access control signal 217 and the input from the set of flash memory banks 130 that indicates the content of flash memory bank. The second comparator output is coupled to the test controller data bus through a multiplexer 240. The second comparator output corresponds to bypass mode, i.e. the accessed data being directly available on the output.

The set of comparators 220 are connected to data output or response from the set of flash memory banks 130. The set of comparators 220 that are enabled by concurrent control signal 212 is configured to compare the response of the flash memory banks 130 and generates a first comparator output value of '0' for an expected response from the flash memory bank and '1', for a mismatch. The comparators 220 disabled by concurrent control signal 212 generate a first comparator value of '0' indicating a good response from the flash memory banks 130. In one embodiment, the comparators are configured by serial access mode (using serial access control signal 217) to bypass the comparators 220 and access a raw response from flash memory bank without changing the access path of the flash memory banks 130. This ensures equivalence of the path without comparator for ease of debug.

Reduction logic 230 takes output of the comparators 220 and generates an output to compress response of all comparators 220 within data bus width of the test controller 135. In one embodiment, the reduction logic 230 output is configured to be a minimum size of single bit indicating combined test-status of the comparators 220 enabled by the concurrent control signal 212. For a wider test controller data-bus width, the reduction logic 230 is configured to provide more granular information such as test-status for each flash memory bank 130 or even each byte of each flash memory bank 130. In serial access mode 215, a slice of the flash memory bank size which is defined by test controller's data-bus width is selected by the multiplexer 240. Each slice is therefore accessed sequentially by the test controller 135.

The control logic 225 receives an input of write-data from the test controller 135 that contains the value to be written into set of flash memory banks 130. The control logic 225 takes a second input of the first comparator output, enabled by concurrent control signal 212, which indicates if the flash memory banks 130 are in the intended state specified in write-data bus. The control logic 225 generates an output bank (input data) to disable write for bits having the same state as write-data bus, and otherwise propagates the write-data bus to bits in a different state from write-data bus.

Figure 3:
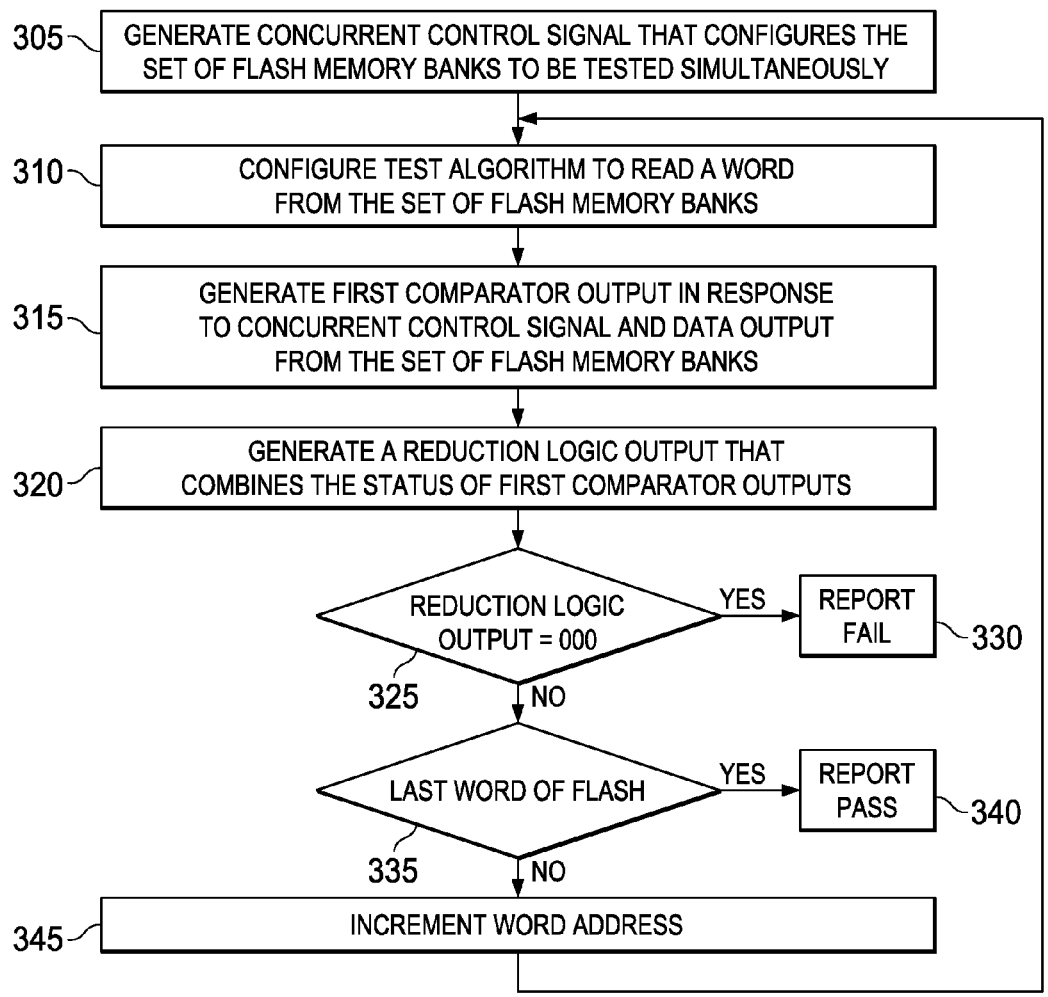
FIG. 3 is a flowchart illustrating a concurrent read operation of the apparatus according to an embodiment.
Figure 4:
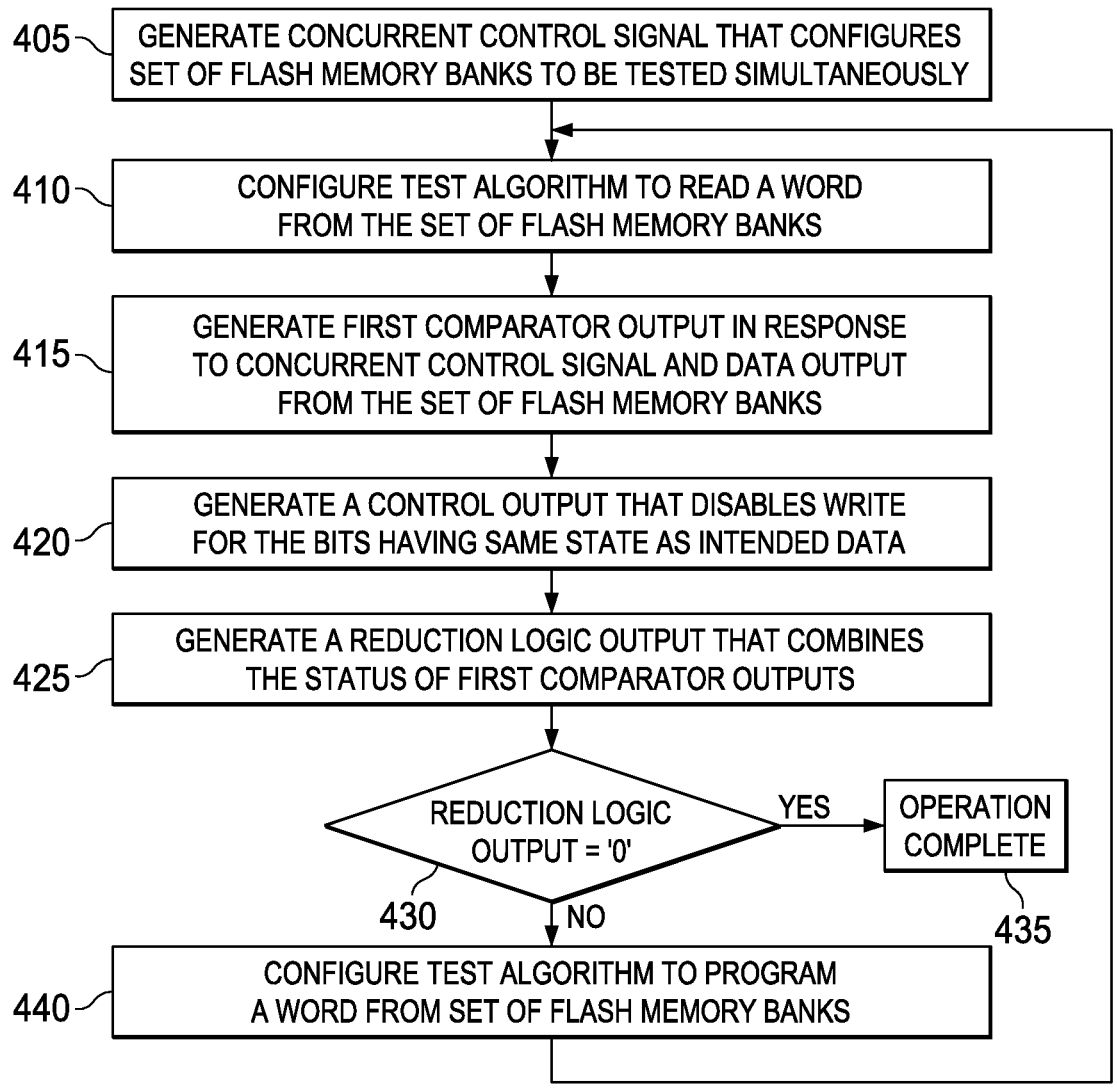
FIG. 4 is a flowchart illustrating a concurrent program operation of the apparatus according to an embodiment.
Figure 5:
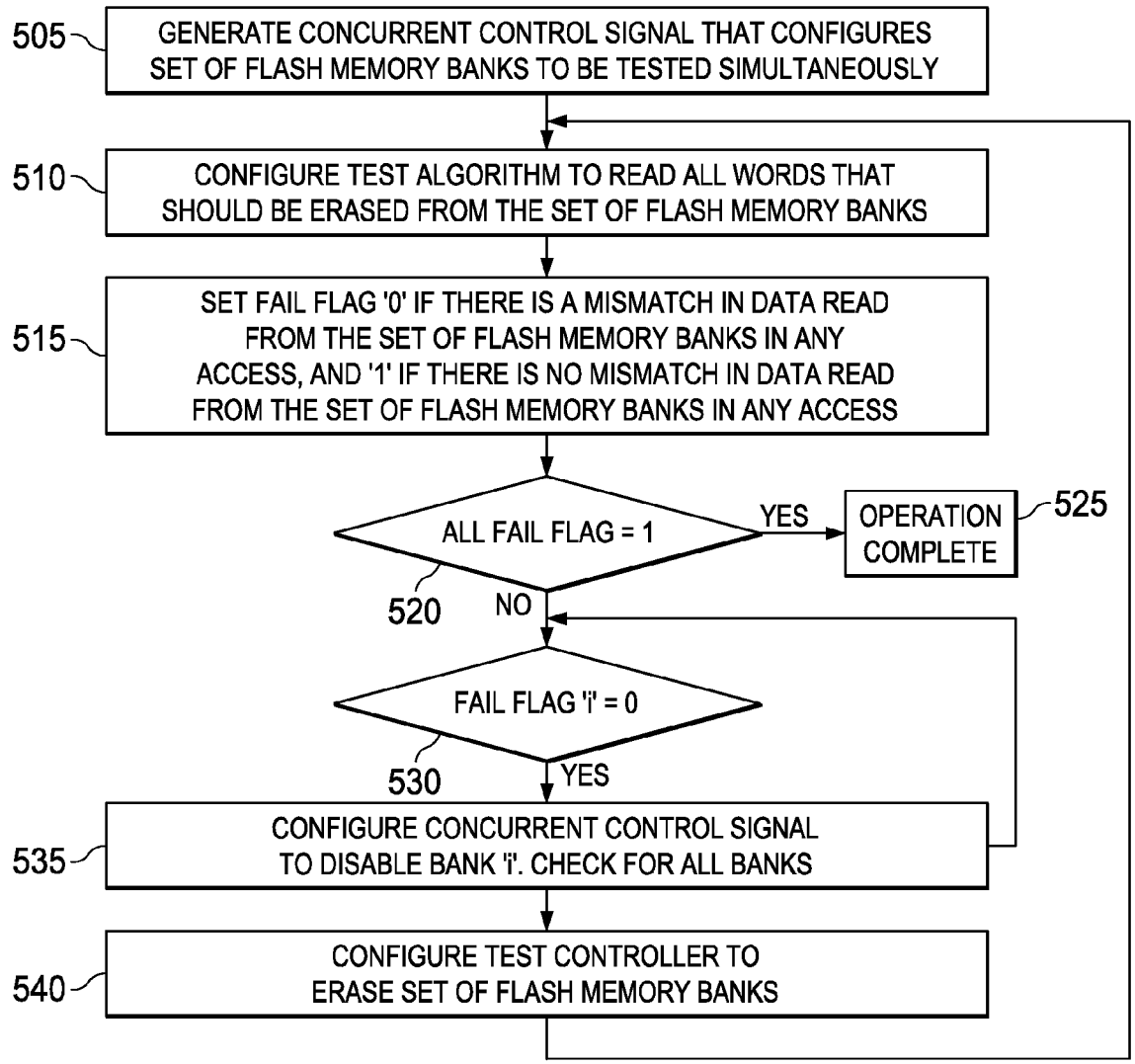
FIG. 5 is a flowchart illustrating a concurrent erase operation of the apparatus according to an embodiment.

FIGS. 3, 4 and 5 illustrate different operations of the apparatus of FIG. 1. Referring now to FIG. 3, a concurrent read operation is illustrated. Operationally, for a concurrent read, the concurrent control signal is generated at step 305. At step 310, the test algorithm is configured to read a word from the set of flash memory banks. At step 315, the set of comparators 220 are configured by the concurrent control signal 212 to generate the comparator output (first comparator output). At step 320, the status of the comparator outputs are combined (and compressed) by the reduction logic 230 to fit within a width of the data bus of test controller 135. The test controller 135 generates a sequence of reads and compares a value of '0' for each access at step 325 till the last word of the flash at step 335 (in case the program value is different from the read value). If the value of the reduction logic output is not '0', then fail is reported at step 330. The test controller indicates a fail to the I/O interface 120 or to the on-chip CPU 110. If the last word of the flash is accessed without any fail reported at step 325, a pass is reported at step 340. It is noted that in one embodiment, all enabled flash memory banks are tested in a single iteration. Further, the word address is incremented at step 345 and the process steps 310 to 335 are repeated.

Referring now to FIG. 4, a concurrent program operation is illustrated. Operationally, for a concurrent program, the concurrent control signal is generated at step 405. At step 410, the test algorithm is configured to read a word from the set of flash memory banks. At step 415, the set of comparators 220 are configured by the concurrent control signal 212 to generate the comparator output. At step 420, the control logic 225 generates a control output that is configured to disable write for the bits having same state as the state of the intended data based on the test stimulus, in the set of flash memory banks. Then, at step 425, the status of the comparator outputs are combined (and compressed) by the reduction logic 230 to fit within a width of the data bus of test controller 135. When all bits return a good value of '0', the operation is completed at step 435. The test controller 135 generates a sequence to write the word to be programmed at step 440. In this case, steps 410 to 435 are repeated until the operation is completed at step 435. For each write iteration, the control logic 225 ensures that any programmed bit is not re-programmed, based on previous read status.

Operationally, for a concurrent erase, comparators are configured by concurrent control signal 210 to generate first comparator output that is compressed by the reduction logic 230 to fit within data-bus width of test controller 135. The test controller 135 generates a sequence to read all locations within sector to be erased. Status logic value of '0' in fail flag indicates that all accessed locations are in erased state. For each bank where fail flag is set, test controller applies the erase sequence. The number of erase cycles in concurrent mode is therefore limited by the slowest bank and independent of the number of banks.

Referring to FIG. 5, a concurrent erase operation is illustrated. Operationally, for a concurrent erase, the concurrent control signal is generated at step 505. At step 510, the test algorithm is configured to read all words that should be erased from the set of flash memory banks and verified to be in erased state. At step 515 the fail flag 235 is set to '0' for the flash memory bank where any word read has a mismatch when compared to erased state. At step 515, fail flag 235 is set to '1' for the flash memory bank where none of the word read has a mismatch when compared to erase state. When all flash memory banks are in erased state at step 520, the operation is complete at step 525. The set of flash memory banks that are in erased state i.e. where fail flag 235 is set to '1' are disabled by concurrent control signal at step 535. The test controller 135 generates a sequence to erase the flash memory bank at step 540. In this case, steps 510 to 535 are repeated until the operation is complete at step 535. For each erase iteration, step 535 ensures that an erased bank is not erased again based on the previous read status.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. An apparatus for concurrent test of a set of flash memory banks, comprising:
   a memory data path module coupled to a test controller, the test controller being configured to generate a test stimulus and to check a response from the set of flash memory banks, the memory data path module comprising:
   a test control module configured to generate a concurrent control signal that configures the set of flash memory banks to be tested simultaneously;
   a set of comparators, corresponding to each of the set of flash memory banks, each comparator configured to generate a first comparator output in response to the concurrent control signal and an input from the set of flash memory banks that indicates a state of the set of flash memory banks;
   a reduction logic configured to generate a reduction logic output that combines a status of the comparator outputs to be compressed to match the width of a data bus of the test controller;
   a control logic configured to generate a control output in response to the test stimulus and the comparator output for selective programming across different flash bits of the set of flash memory banks; and
   a fail flag configured to generate one of an output value '0' if there is a mismatch in data read from the set of flash memory banks in any access, and an output value 1 if there is no mismatch in data read from the set of flash memory banks in any access.

2. The apparatus of claim 1, wherein the test control module is configured to generate a serial access control signal that configures the set of flash memory banks to be tested without the set of comparators.

3. The apparatus of claim 2, wherein the serial access control signal configures the set of flash memory banks to be tested without the set of comparators by configuring the comparator to pass response from the set of flash memory banks without changing the access path for failure analysis.

4. The apparatus of claim 1, wherein each comparator is configured to generate a second comparator output in response to the serial access control signal and the input from the set of flash memory banks.

5. The apparatus of claim 1 further comprising a multiplexer that is configured to select one of the reduction logic output and the second comparator output that is provided to the test controller.

6. The apparatus of claim 1, wherein the intended operation comprises one of read, program and erase operation.

7. The apparatus of claim 1, wherein the first comparator output indicates if the set of memory banks contains a value corresponding to an intended data based on the test stimulus.

8. The apparatus of claim 1, wherein the test controller is one of a programmable built-in self-test controller and an on-chip CPU.

9. An apparatus for concurrent test of a set of flash memory banks, comprising:
- a test controller configured to generate a test stimulus and to check a response from the set of flash memory banks;
- an on chip memory configured to store test operation sequences being executed through the test controller;
- a test interface configured to program the test controller; and
- a memory data path module coupled to the test controller, the memory data path module comprising:
  - a test control module configured to generate a concurrent control signal that configures the set of flash memory banks to be tested simultaneously;
  - a set of comparators, corresponding to each of the set of flash memory banks, each comparator configured to generate a first comparator output in response to the concurrent control signal and an input from the set of flash memory banks that indicates a state of the set of flash memory banks;
  - a reduction logic configured to generate a reduction logic output that combines a status of the comparator outputs;
  - a control logic configured to generate a control output in response to the test stimulus and the first comparator output that disables an intended operation for bits having a same state as an intended data, based on the test stimulus, in the set of flash memory banks; and
  - a fail flag configured to generate one of an output value '0' if there is a mismatch in data read from the set of flash memory banks in any access, and an output value 1 if there is no mismatch in data read from the set of flash memory banks in any access.

10. The apparatus of claim 9, wherein:
- the test control module is configured to generate a serial access control signal that configures the set of flash memory banks to be tested without the set of comparators; and
- each comparator is configured to generate a second comparator output in response to the serial access control signal and the input from the set of flash memory banks.

11. The apparatus of claim 9, wherein the intended operation comprises one of read, program and erase operation.

12. The apparatus of claim 11, wherein for a read operation, the test control module is configured to generate the concurrent control signal for all the banks to be tested in the set of flash memory banks and the memory data path module is configured to select the reduction logic output; and wherein the test stimulus comprises a sequence of reads with associated control signals.

13. The apparatus of claim 11, wherein for a program operation, the test control module is configured to generate the concurrent control signal for all the banks to be tested in the set of flash memory banks and the memory data path module is configured to select the reduction logic output; and wherein the test stimulus comprises a sequence of reads followed by write for a location to be programmed.

14. The apparatus of claim 11, wherein for an erase operation, the test control module is configured to generate the concurrent control signal for all the banks to be tested in the set of flash memory banks and the memory data path module is configured to select the reduction logic output; and wherein the test stimulus comprises a test sequence to read all erased locations, to read a status of the fail flag and to disable the set of flash memory banks that do not have a fail flag set, followed by operation to erase the flash memory bank words.

15. A method for concurrent test of a set of flash memory banks, comprising:
- generating a concurrent control signal that configures the set of flash memory banks to be tested simultaneously;
- generating a test stimulus and checking a response from the set of flash memory banks;
- generating a first comparator output in response to the concurrent control signal and an input from the set of flash memory banks that indicates a state of the set of flash memory banks;
- generating a reduction logic output that combines a status of the comparator outputs;
- generating a control output in response to the test stimulus and the first comparator output that disables an intended operation for bits having a same state as an intended data, based on the test stimulus, in the set of flash memory banks; and
- generating one of an output value '0' if there is a mismatch in data read from the set of flash memory banks in any access, and an output value 1 if there is no mismatch in data read from the set of flash memory banks in any access.

16. The method of claim 15 further comprising:
- generating a serial access control signal that configures the set of flash memory banks to be tested without the set of comparators; and
- generating a second comparator output in response to the serial access control signal and the input from the set of flash memory banks.

* * * * *